(12) United States Patent
Yang et al.

(10) Patent No.: US 11,682,658 B2
(45) Date of Patent: Jun. 20, 2023

(54) LIGHT-EMITTING PACKAGE AND METHOD OF MANUFACTURING THE SAME

(71) Applicant: Unimicron Technology Corp., Taoyuan (TW)

(72) Inventors: Kai-Ming Yang, Hsinchu County (TW); Chen-Hao Lin, Keelung (TW); Chia-Hao Chang, Hsinchu (TW); Tzu-Nien Lee, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 239 days.

(21) Appl. No.: 17/125,981

(22) Filed: Dec. 17, 2020

(65) Prior Publication Data
US 2022/0139886 A1    May 5, 2022

(30) Foreign Application Priority Data

Nov. 4, 2020   (TW) .................................. 109138500

(51) Int. Cl.
| | |
|---|---|
| *H01L 25/075* | (2006.01) |
| *H01L 33/54* | (2010.01) |
| *H01L 33/62* | (2010.01) |

(52) U.S. Cl.
CPC .......... *H01L 25/0753* (2013.01); *H01L 33/54* (2013.01); *H01L 33/62* (2013.01); *H01L 2933/005* (2013.01); *H01L 2933/0066* (2013.01)

(58) Field of Classification Search
CPC . H01L 25/0753; H01L 25/0655; H01L 33/54; H01L 33/62; H01L 33/60;
(Continued)

(56) References Cited

U.S. PATENT DOCUMENTS

| | | | |
|---|---|---|---|
| 2018/0102348 A1* | 4/2018 | Haiberger | ............... H01L 33/54 |
| 2020/0135997 A1* | 4/2020 | Hu | ........................... H01L 33/10 |

FOREIGN PATENT DOCUMENTS

TW    201937763 A    9/2019

OTHER PUBLICATIONS

Frank Singer et al., "Fan-Out Wafer and Panel Level Technology for Advanced LED Packaging", ReserchGate, Conference Paper, Feb. 2018.

* cited by examiner

*Primary Examiner* — Antonio B Grite
(74) *Attorney, Agent, or Firm* — CKC & Partners Co., LLC

(57) ABSTRACT

A light-emitting package includes an encapsulating member, a plurality of light-emitting components disposed in the encapsulating member, a plurality of first electrode pads, a plurality of second electrode pads, and a plurality of conductive connection structures. The encapsulating member has a first surface and a second surface opposite to each other. Each light-emitting component has a light-emitting surface exposed on the first surface. Both the first electrode pads and the second electrode pads are exposed on the second surface. A first bonding surface of each first electrode pad and a second bonding surface of each second electrode pad are both flush with the second surface. The light-emitting components disposed on the first electrode pads are electrically connected to the first electrode pads. The conductive connection structures passing through the encapsulating member are electrically connected to the light-emitting components and the second electrode pads.

9 Claims, 7 Drawing Sheets

(58) Field of Classification Search
CPC ... H01L 33/58; H01L 33/38; H01L 2933/005; H01L 2933/0066; H01L 27/1214; H01L 23/5381; H01L 33/10; H01S 5/04254
See application file for complete search history.

LIGHT-EMITTING PACKAGE AND METHOD OF MANUFACTURING THE SAME

CROSS-REFERENCE TO RELATED APPLICATION

This application claims priority to Taiwan Application Serial Number 109138500, filed Nov. 4, 2020, which is herein incorporated by reference in its entirety.

BACKGROUND

Field of Invention

The present disclosure relates to a semiconductor package and the method of manufacturing thereof. More particularly, the present disclosure relates to a light-emitting package and the method of manufacturing the same.

Description of Related Art

In a common manufacturing method of a light emitting diode (LED) package, a molding compound is usually employed to encapsulate a plurality of LEDs, in which the molding compound need to be cured, so the molding compound can protect the LEDs. After curing the molding compound, it is usual to make a circuit that is electrically connected to LEDs, so that the LEDs can be electrically connected to an external power supply via the circuit.

Before making the circuit, the cured molding compound is usually separated from the mold or the support board. Next, the cured molding compound is drilled to make the circuit. However, when the cured molding compound is separated from the mold or the support board, the molding compound will deform. That is, the volume or size of the molding compound is changed, thereby causing the inside LEDs to shift, so that it is necessary to adjust the process parameters in the subsequent process of manufacturing the circuit. Otherwise, it is possible to result in a broken circuit subsequently because the circuit is not able to be electrically connected to the LEDs. Therefore, the LED package is necessarily reworked, even scrapped.

SUMMARY

At least one embodiment of the disclosure provides a light-emitting package which can reduce or prevent the above-mentioned shifts in the LEDs.

At least one embodiment of the disclosure provides a method of manufacturing the abovementioned light-emitting package.

A light-emitting package according to at least one embodiment of the disclosure includes an encapsulating member, a plurality of light-emitting components, a plurality of first electrode pads, a plurality of second electrode pads and a plurality of conductive connection structures. The encapsulating member has a first surface and a second surface opposite to the first surface. The light-emitting components respectively have a plurality of light-emitting surfaces and a plurality of back surfaces opposite to the light-emitting surfaces, where the light-emitting components are disposed in the encapsulating member, and the light-emitting surfaces are exposed on the first surface. The first electrode pads disposed in the encapsulating member respectively have a plurality of first bonding surfaces. The light-emitting components are respectively disposed on the first electrode pads and electrically connected to the first electrode pads, wherein the first bonding surfaces are exposed on the second surface and flush with the second surface. The second electrode pads disposed in the encapsulating member respectively have a plurality of second bonding surfaces, where the second bonding surfaces are exposed on the second surface and flush with the second surface. The conductive connection structures pass through the encapsulating member and are electrically connected to the light-emitting components and the second electrode pads, so that each of the light-emitting components is electrically connected to one of the first electrode pads and one of the second electrode pads.

In a method of manufacturing a light-emitting package according to at least one embodiment of the disclosure, first, a plurality of first electrode pads and a plurality of second electrode pads are formed on a substrate. Next, a plurality of light-emitting components are respectively disposed on the first electrode pads, in which the light-emitting components respectively have a plurality of light-emitting surfaces and are electrically connected to the first electrode pads respectively. Next, a molding compound is formed on the substrate, in which the molding compound covers the light-emitting components, the first electrode pads, and the second electrode pads. The molding compound is attached to the substrate. The molding compound on the substrate is patterned, so as to form an encapsulating member having a plurality of blind vias and a plurality of light-emitting openings, in which the light-emitting openings expose the light-emitting surface respectively, whereas the blind vias expose the second electrode pads respectively. A plurality of conductive connection structures are formed on the first surface and in the blind vias, in which the conductive connection structures are electrically connected to the light-emitting components and the second electrode pads, and the substrate remains intact during forming the conductive connection structures. After forming the conductive connection structures, at least one part of the substrate is removed.

Based on the above, the conductive connection structures are formed before at least one part of the substrate is removed. In other words, both the molding compound and the encapsulating member are still disposed on and attached to the substrate before the conductive connection structures are formed, so that the positions of the light-emitting components on the substrate can basically keep unchanged, thereby reducing or preventing the shifts in the light-emitting components. Hence, in the process of patterning the molding compound and the formation of the conductive connection structures, basically, it is not necessary to consider the shifts in the light-emitting components for adjusting the process parameters, so that the manufacturing process can be simplified, thereby helping to shorten the time required to manufacture the light-emitting package.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
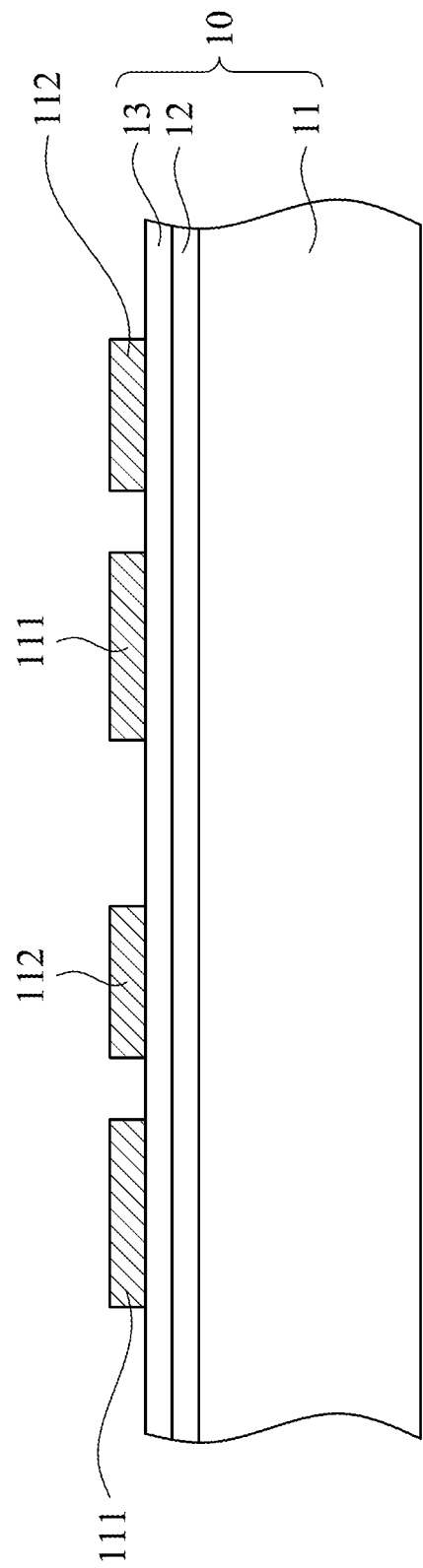
FIGS. 1 to 7 are schematic cross-sectional views of a method of manufacturing a light-emitting package according to at least one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unequal proportions. Therefore, the description and explanation of the following embodiments are not limited to the sizes and shapes presented by the elements in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case are mainly for illustration, and are not intended to accurately depict the actual shape of the elements, nor are they intended to limit the scope of patent applications in this case.

Secondly, the words "about", "approximately", or "substantially" appearing in the content of the present disclosure not only cover the clearly stated values and range of values, but also include those with ordinary knowledge in the technical field to which the invention belongs. The allowable deviation range, which can be determined by the error generated during the measurement, and the error is caused by the limitation of the measurement system or the process conditions, for example. In addition, "about" may be expressed within one or more standard deviations of the above values, such as within ±30%, ±20%, ±10%, or ±5%. The words "about", "approximately" or "substantially" appearing in this text can choose acceptable deviation range or standard deviation according to optical properties, etching properties, mechanical properties or other properties, not just one Standard deviation to apply all the above optical properties, etching properties, mechanical properties and other properties.

Figure 5:
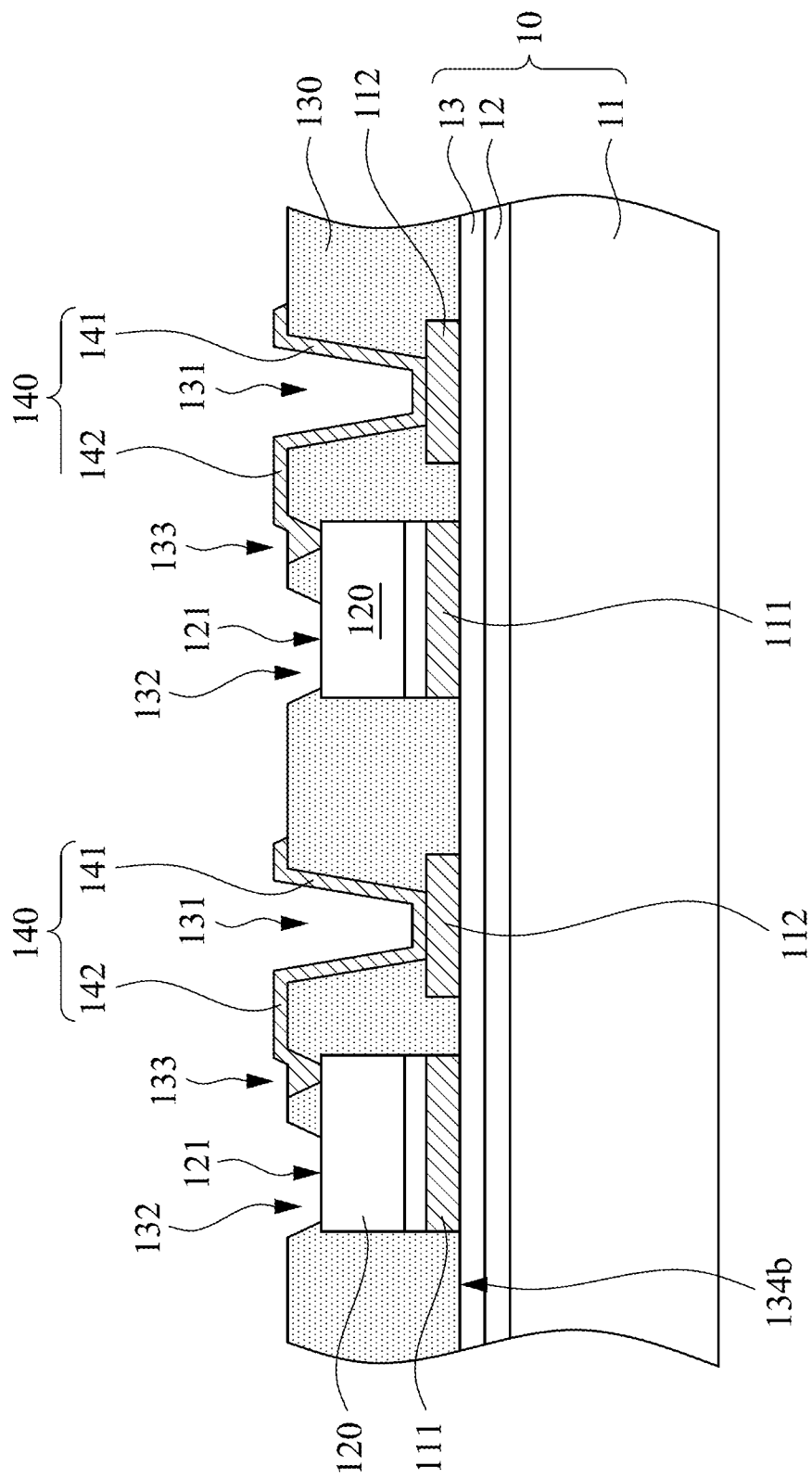
Figure 6:
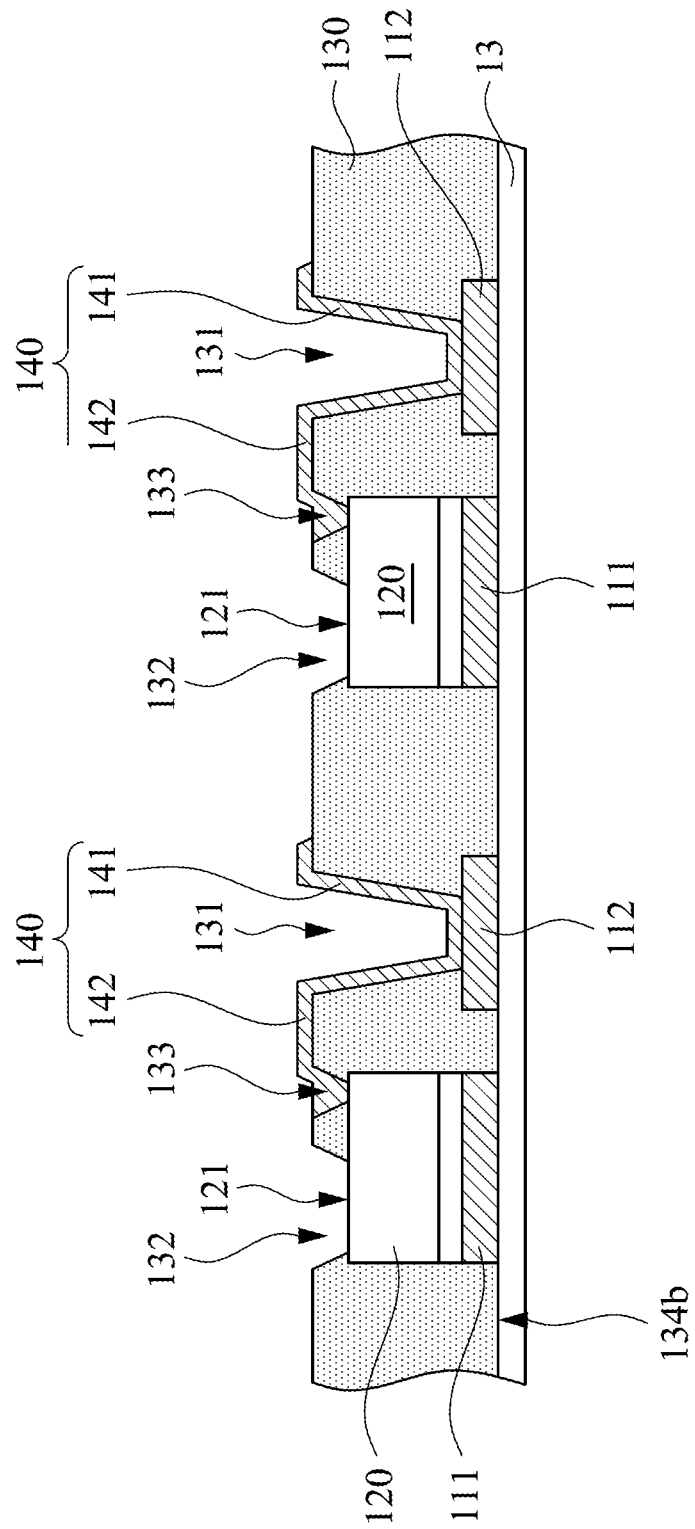
Figure 7:
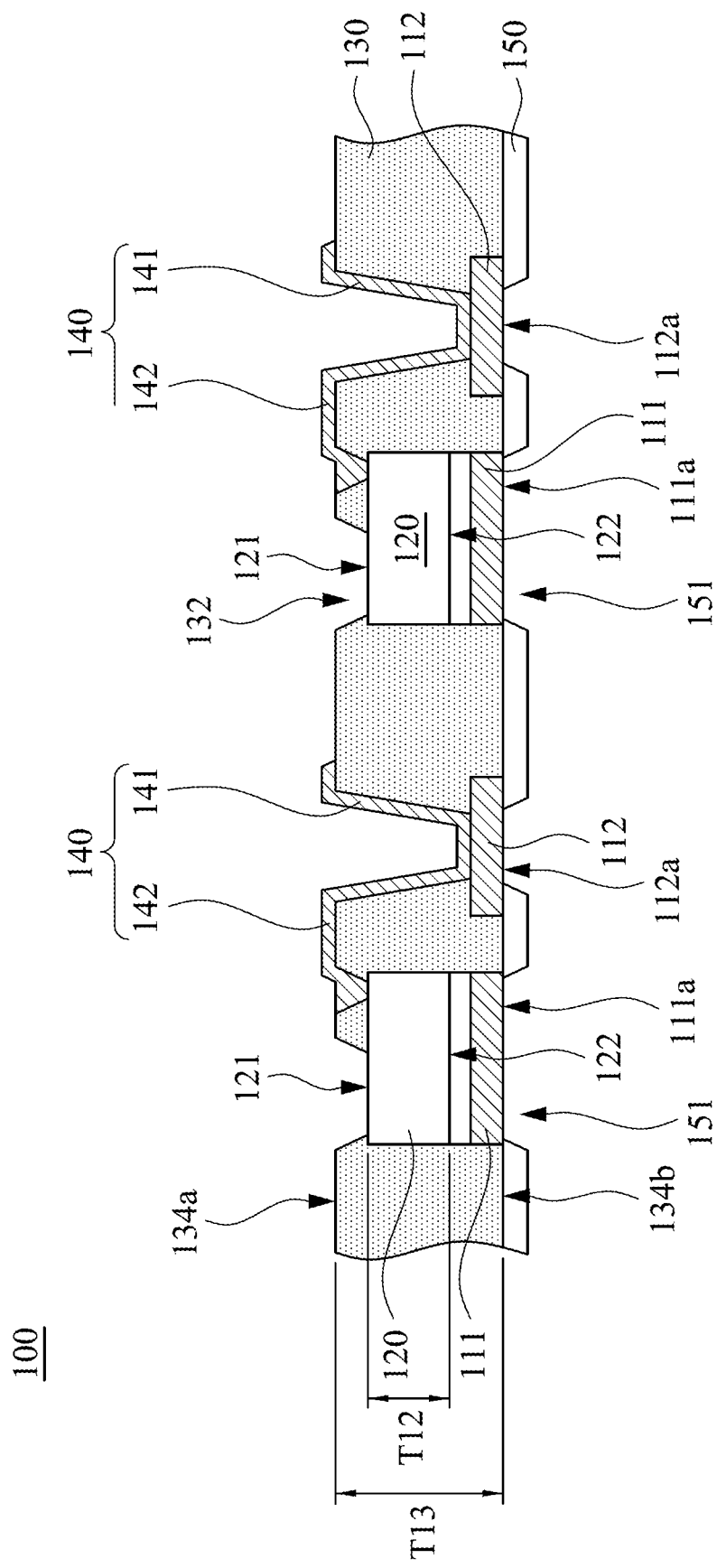

FIGS. 1 to 7 are schematic cross-sectional views of a method of manufacturing a light-emitting package according to at least one embodiment of the disclosure, in which FIG. 7 illustrates a light-emitting package 100 which is complete. Referring to FIG. 1, in the method of manufacturing the light-emitting package according to the present embodiment, first, a plurality of first electrode pads 111 and a plurality of second electrode pads 112 are formed on the substrate 10, in which the first electrode pads 111 and the second electrode pads 112 may be arranged in an array.

The first electrode pads 111 and the second electrode pads 112 may be metal layers and formed by deposition and photolithography, in which the deposition may include electroless plating and electroplating. Alternatively, the deposition may also include physical vapor deposition (PVD) and electroplating. The photolithography includes exposure, developing, and etching.

The method of forming the first electrode pads 111 and the second electrode pads 112 may include additive process, subtractive process, or semi-additive process. Taking the semi-additive process for example, first, a thin metal layer is formed on the substrate 10 and used as a seed layer, where the thin metal layer can be formed by PVD, electroless plating or electroplating.

Afterward, a patterned mask (not shown) is formed on the thin metal layer, in which the patterned mask may be formed by a photoresist or a dry film which is exposed and developed. Next, metal is deposited on the part of the thin metal layer (i.e., seed layer) which is exposed by the patterned mask by using electroplating. Afterward, the patterned mask is removed, and micro-etching is performed, so as to remove the part of the thin metal layer which is covered by the patterned mask originally, thereby forming the first electrode pads 111 and the second electrode pads 112 separated from each other.

The substrate 10 can include a rigid support board 11, a release layer 12, and an insulating layer 13. The rigid support board 11 may be a hard or firm board, such as glass plate, metal plate, or ceramic board. The release layer 12 is formed on the rigid support board 11, whereas the insulating layer 13 is formed on the release layer 12, so the release layer 12 is located between the insulating layer 13 and the rigid support board 11.

Both the first electrode pads 111 and the second electrode pads 112 are formed on the insulating layer 13, in which the first electrode pads 111 and the second electrode pads 112 can directly touch the insulating layer 13. In addition, the insulating layer 13 can be made of photoimageable dielectric (PID) material, so the insulating layer 13 may have photo sensitivity and can be patterned by exposure and developing.

It is noted that in the embodiment shown in FIG. 1, the substrate 10 includes the rigid support board 11, the release layer 12, and the insulating layer 13. However, in other embodiment, the insulating layer 13 can be replaced by a dielectric layer without photo sensitivity. Alternatively, the substrate 10 may include the rigid support board 11 only, not include the release layer 12 and the insulating layer 13, in which the rigid support board 11 may be a metal plate and directly touch both the first electrode pads 111 and the second electrode pads 112. In other words, the substrate 10 may be the rigid support board 11 which is made of metal. The metal material of the rigid support board 11 is different from the metal materials of both the first electrode pads 111 and the second electrode pads 112. For example, the rigid support board 11 can be made of copper, whereas both of the first electrode pads 111 and the second electrode pads 112 can be made of nickel.

Figure 2:
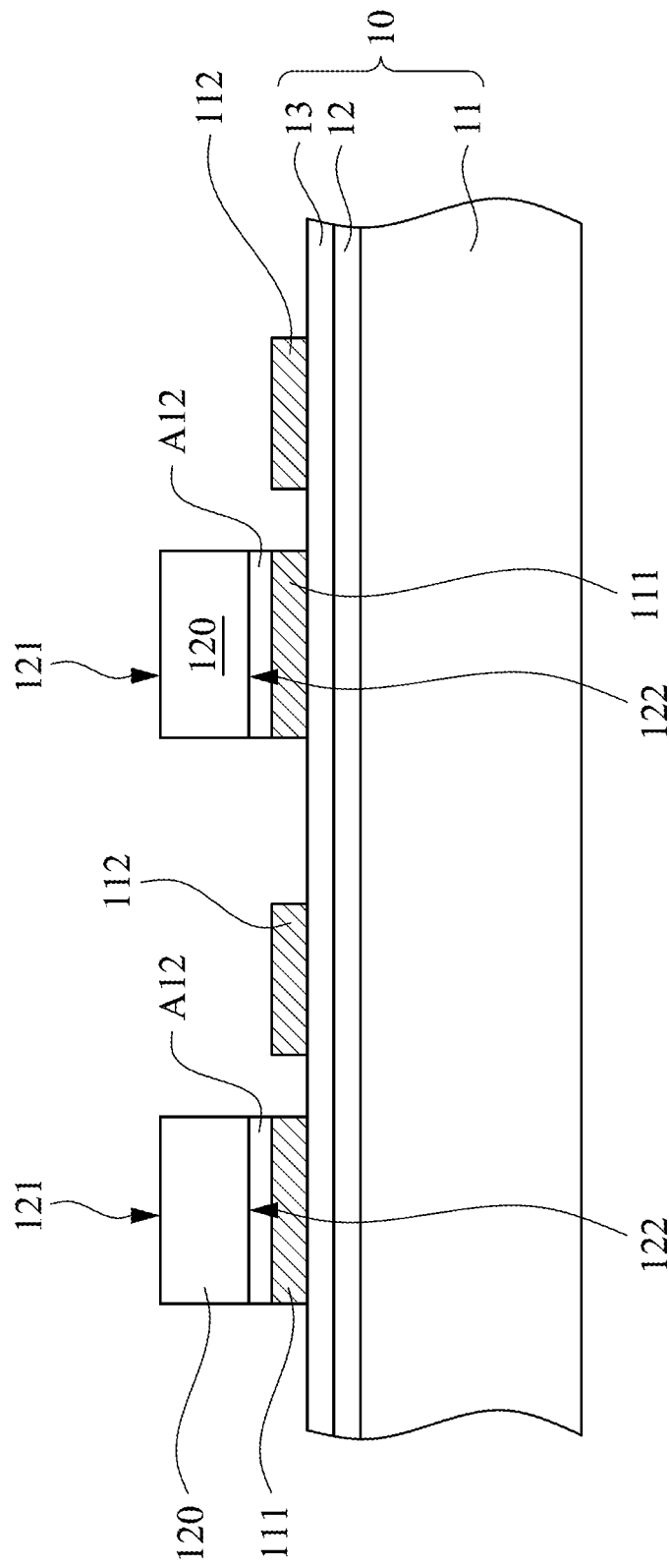

Referring to FIG. 2, next, a plurality of light-emitting components 120 are disposed on the first electrode pads 111 respectively. The light-emitting components 120 can be electrically connected to the first electrode pads 111 by using a plurality of conductive adhesive materials A12, in which the conductive adhesive materials A12 which may be solder, silver glue, or copper paste, for example. The conductive adhesive materials A12 can bond the light-emitting components 120 and the first electrode pads 111, so that the light-emitting components 120 can be attached to and be electrically connected to the first electrode pads 111 one by one.

The light-emitting components 120 respectively have a plurality of light-emitting surface 121 and a plurality of back surfaces 122 opposite to the light-emitting surface 121. When the light-emitting components 120 are powered by electricity, the light-emitting components 120 can emit rays of light from the light-emitting surface 121. The conductive adhesive material A12 can be bonded to the back surfaces 122 of the light-emitting components 120 and can directly touch the back surfaces 122. All of the light-emitting components 120 may be vertical LED dies, so each of the light-emitting components 120 may be a die, which is not packaged, and has a anode and a cathode (both not shown) located at two opposite sides respectively.

For example, in one of the embodiments, the anode can be located on the back surfaces 122, whereas the cathode can be located on the light-emitting surface 121. Certainly, in other embodiment, the cathode can be located on the back surfaces 122, whereas the anode can be located on the light-emitting surface 121. Hence, the conductive adhesive material A12 bonded to the back surfaces 122 can be electrically connected to the anode or the cathode of the light-emitting component 120. Accordingly, the electrodes (i.e., anode and cathode) of the light-emitting components 120 can be electrically connected to the first electrode pads 111 respectively by using the conductive adhesive materials A12.

Figure 3:
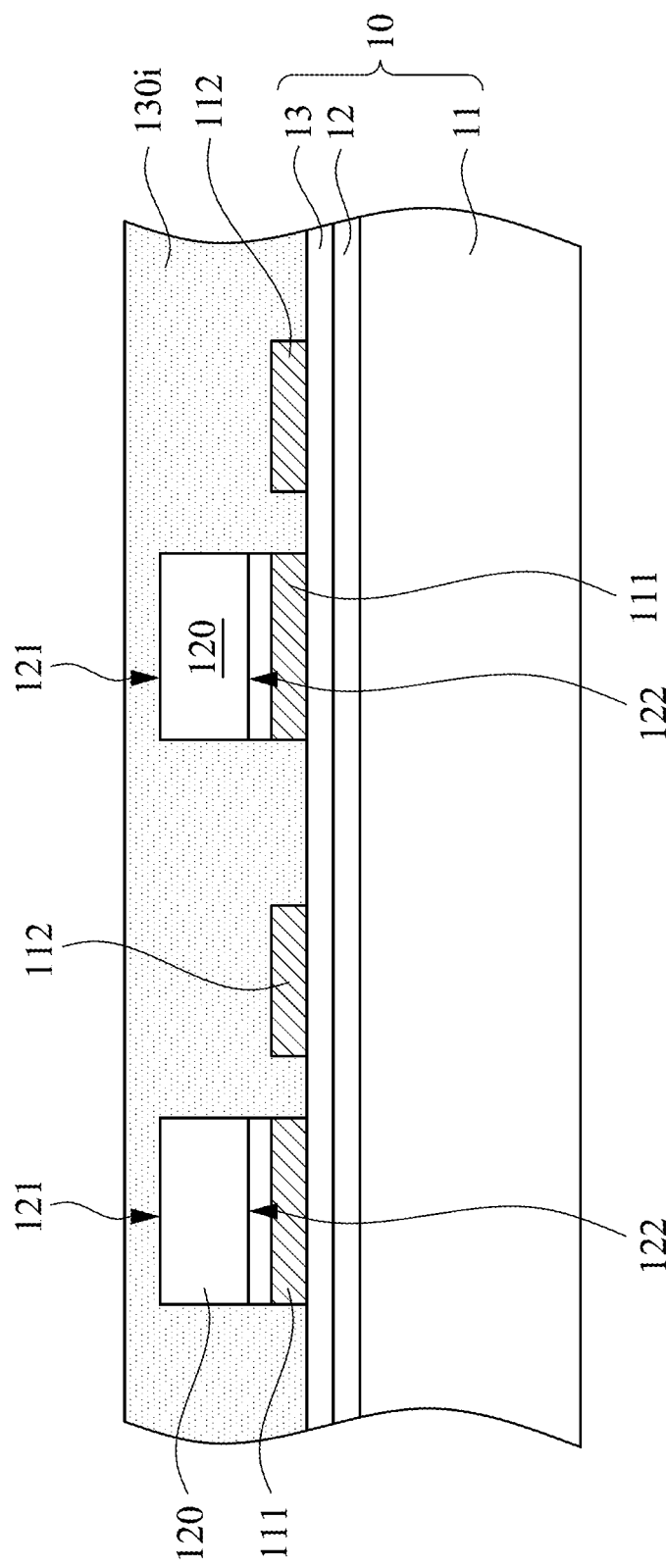

Referring to FIG. 3, afterward, a molding compound 130i is formed on the substrate 10, in which the molding compound 130i covers the light-emitting components 120, the first electrode pads 111, and the second electrode pads 112, and the molding compound 130i is attached to the substrate 10, so that the light-emitting components 120, the first electrode pads 111, and the second electrode pads 112 are all disposed and embedded in the molding compound 130i. The molding compound 130i can be formed by coating or laminating, in which the molding compound 130i formed by laminating can be pressed to the substrate 10 and the light-emitting components 120, first electrode pads 111, and the second electrode pads 112 thereon.

The main material of the molding compound 130i can be a polymer material, and the steps of forming the molding compound 130i include curing. For example, the molding compound 130i can be cured by light irradiation or heating, in which the light irradiation can employ ultraviolet (UV) light to irradiate the molding compound 130i, thereby curing the molding compound 130i. In the process of curing the molding compound 130i, the molding compound 130i which is still disposed on and attached to the substrate 10 deforms. That is, the volume or size of the molding compound 130i is changed, such as shrinking.

When the molding compound 130i on the substrate 10 deforms, there is not only a bonding force but also stress generated between the substrate 10 and the molding compound 130i because the molding compound 130i is still attached to the substrate 10. The bonding force and the rigidity of the substrate 10 resist the stress and the deformation of the molding compound 130i, so as to prevent the deformed molding compound 130i from moving the light-emitting components 120 and from causing the light-emitting components 120 to shift. Thus, the light-emitting components 120 basically remain stationary by using the bonding force and the substrate 10 during curing the molding compound 130i.

In the present embodiment, the optical density (OD) of the molding compound 130i can be larger than 2, so the molding compound 130i has fairly low optical transmittance, in which the color of the molding compound 130i may be black. Moreover, the thermal conductivity of the molding compound 130 can range between 5 and 10 $W \cdot m^{-1} \cdot K^{-1}$. Hence, the molding compound 130i can have good thermal conductivity, so that the molding compound 130i can transmit and dissipate the heat generated by the light-emitting components 120 quickly, so as to prevent the overheating of the light-emitting components 120 due to the heat accumulation.

Figure 4:
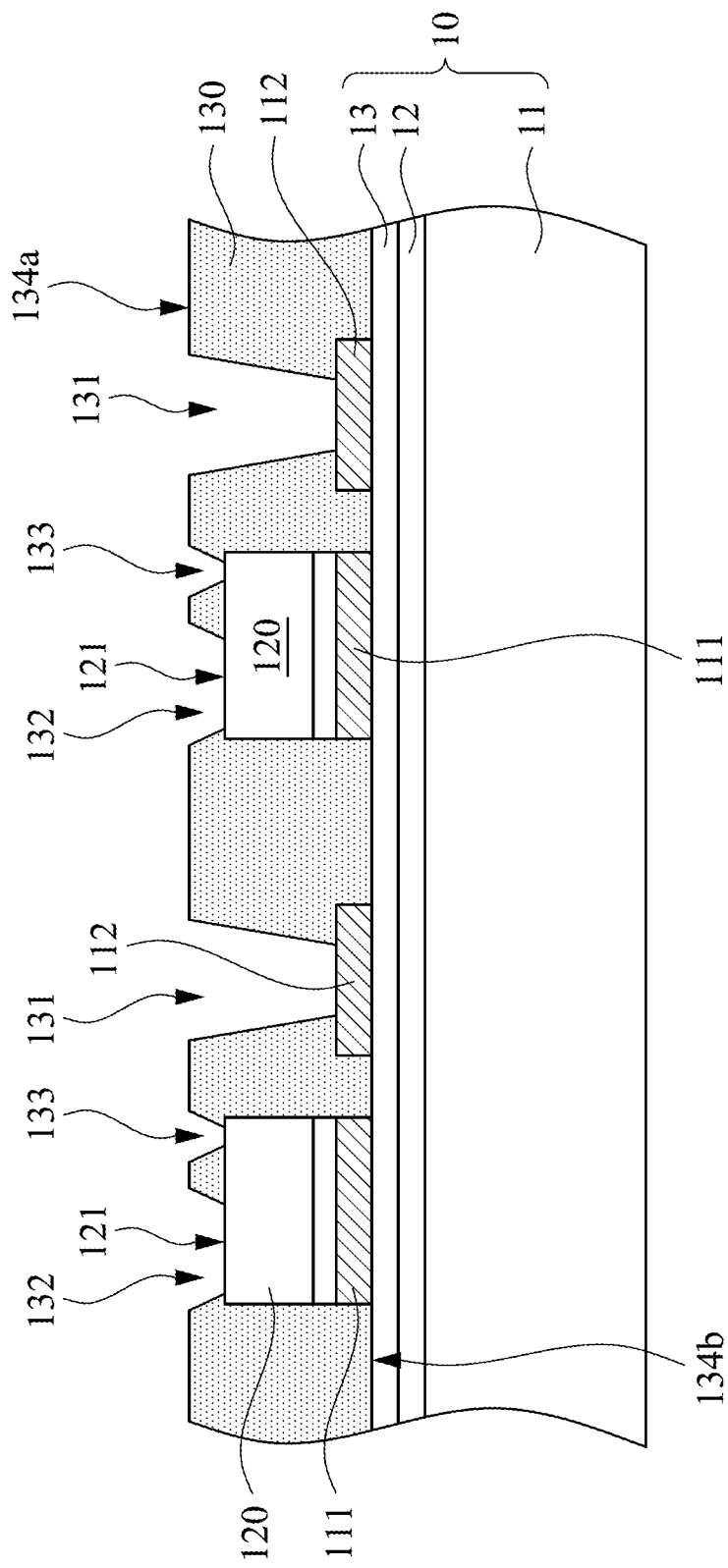

Referring to FIG. 3 and FIG. 4, next, the molding compound 130i on the substrate 10 is patterned to form an encapsulating member 130 having a plurality of blind vias 131 and a plurality of light-emitting openings 132. The encapsulating member 130 further has a first surface 134a and a second surface 134b opposite to the first surface 134a, in which the light-emitting openings 132 are formed in the first surface 134a and respectively expose the light-emitting surfaces 121 of the light-emitting components 120. That is, the light-emitting surfaces 121 are exposed on the first surface 134a. The blind vias 131 extend from the first surface 134a to the second surface 134b and expose the second electrode pads 112 respectively. In addition, the encapsulating member 130 may further have a plurality of connective holes 133 in the first surface 134a, in which the connective holes 133 expose the light-emitting components 120 partially and further expose the electrode (e.g., anode or cathode) on the light-emitting surface 121.

Patterning the molding compound 130i can include photolithography or laser ablation. In other words, the blind vias 131, the light-emitting openings 132, and the connective holes 133 can be formed by etching or laser ablation. When patterning the molding compound 130i is photolithography, the blind vias 131, the light-emitting openings 132, and the connective hole 133 can be formed in the same etching process. In other words, the blind vias 131, the light-emitting openings 132, and the connective holes 133 can be basically formed at the same time. Moreover, the optical density of the molding compound 130i can be larger than 2, whereas the thermal conductivity of the molding compound 130i can range between 5 and 10 $W \cdot m^{-1} \cdot K^{-1}$. Thus, the optical density of the molding compound 130 can be larger than 2, whereas the thermal conductivity of the molding compound 130 can range between 5 and 10 $W \cdot m^{-1} \cdot K^{-1}$.

During patterning the molding compound 130i, the molding compound 130i is still disposed on and attached to the substrate 10, so that the positions of the light-emitting components 120 on the substrate 10 can basically keep unchanged. Therefore, in the process of patterning the molding compound 130i, basically, it is not necessary to consider the shifts in the light-emitting components 120 for adjusting the process parameters. For example, it is not necessary to change the pattern and the position of the photomask, or to adjust the position of the laser beam depending on the shifts in light-emitting components 120. Accordingly, the manufacturing process can be simplified, and the yield can be promoted.

Referring to FIG. 5, next, a plurality of conductive connection structures 140 are formed on the first surface 134a and in the blind vias 131, in which the conductive connection structures 140 passing through the encapsulating member 130 are electrically connected to the light-emitting components 120 and the second electrode pads 112, so that each of the light-emitting components 120 can be electrically connected to one of the first electrode pads 111 and one of the second electrode pads 112. Hence, the external power supply can input electric current to the light-emitting components 120 from the first electrode pads 111 and the second electrode pads 112, so as to cause the light-emitting components 120 to shine.

Each of the conductive connection structures 140 may include a conductive column 141 and a conductive layer 142. The conductive column 141 passing through the encapsulating member 130 is connected to the second electrode pads 112, where the conductive column 141 may be a conductive blind vias structure, and the conductive column 141 may be a solid metal column or a hollow metal column (as shown in FIG. 5). The conductive layer 142 can be formed on the first surface 134a and connected to the conductive column 141 and the light-emitting component 120, where each of the conductive layers 142 can extend from the first surface 134a to the inside of the connective hole 133, and can be connected to one of the electrodes (i.e., anode or cathode) of the light-emitting component 120 via the connective hole 133. In addition, in the present embodiment, at least one of the conductive columns 141 may be located between two adjacent light-emitting components 120, as shown in FIG. 5.

The formation of the conductive connection structures 140 can include deposition and photolithography, in which the deposition may include electroless plating and electroplating. During forming the conductive connection structures 140, the substrate 10 remains intact, while the encapsulating member 130 is still disposed on and attached to the substrate 10. Accordingly, the positions of the light-emitting components 120 on the substrate 10 basically keep unchanged. Hence, in the process of forming the conductive connection structures 140, basically, it is not necessary to consider the shifts in the light-emitting components 120 for adjusting the process parameters. For example, it is not necessary to change the pattern and the position of the photomask depending on the shifts in light-emitting components 120.

Therefore, before the conductive connection structures 140 are formed, the molding compound 130i and the encapsulating member 130 are still disposed on and attached to the substrate 10, so that the positions of the light-emitting components 120 on the substrate 10 can basically keep unchanged. Accordingly, in the processes of patterning the molding compound 130i and forming the conductive connection structures 140, basically, it is not necessary to consider the shifts in the light-emitting components 120 for adjusting the process parameters, so that the manufacturing process can be simplified, thereby helping to shorten the time required to manufacture the light-emitting package and promoting the yield.

Referring to FIG. 5 and FIG. 6, after the conductive connection structures 140 are formed, at least one part of the substrate is removed. The removal of at least one part of the substrate 10 in the present embodiment may be peeling, in which the release layer 12 and the rigid support board 11 can be peeled from the insulating layer 13 to remove both the release layer 12 and the rigid support board 11 and to keep the insulating layer 13. Moreover, in addition to peeling, the removal of at least one part of the substrate 10 may be etching in other embodiment.

Specifically, the substrate 10 can include only the rigid support board 11 which is made of metal and can directly touch the first electrode pads 111 and the second electrode pads 112, where the metal material (e.g., copper) of the rigid support board 11 is different from the metal materials (e.g., nickel) of both the first electrode pads 111 and the second electrode pads 112, so that an etchant (e.g., sodium hydroxide), which can substantially etch the rigid support board 11 but not etch both the first electrode pads 111 and the second electrode pads 112, can be selected and used for removing the substrate 10 completely. Therefore, the removal of at least one part of the substrate 10 is not limited to peeling, where the substrate 10 can be removed partially or completely, so the removal of the substrate 10 is not limited to FIG. 5 and FIG. 6.

Referring to FIG. 6 and FIG. 7, after at least one part of the substrate 10 is removed, a plurality of openings 151 can be formed in the insulating layer 13, so as to form a protective layer 150 on the second surface 134b. Accordingly, the protective layer 150 can be formed from the insulating layer 13. The openings 151 respectively expose the first bonding surfaces 111a of the first electrode pads 111 and the second bonding surfaces 112a of the second electrode pads 112. At this time, a light-emitting package 100 including a plurality of first electrode pads 111, a plurality of second electrode pads 112, a plurality of light-emitting components 120, an encapsulating member 130, a plurality of conductive connection structures 140, and a protective layer 150 is basically complete, where the light-emitting components 120 can be embedded in the encapsulating member 130.

Both the first bonding surfaces 111a and the second bonding surfaces 112a can be connected to the solder and mounted on a wiring board or a carrier via the solder, so that the light-emitting package 100 can be electrically connected to the wiring board or the carrier. In addition, at least one wiring layer can be made on the first bonding surfaces 111a and the second bonding surfaces 112a. For example, one or more wiring layers can be made on the second surface 134b of the encapsulating member 130 by using buildup, in which the wiring layer is electrically connected to the first electrode pads 111 and the second electrode pads 112, so as to redistribute the first electrode pads 111 and the second electrode pads 112.

Since the insulating layer 13 may have the photo sensitivity, the formation of the openings 151 can be exposing and developing the insulating layer 13. In addition, in other embodiment, the insulating layer 13 may have no photo sensitivity, so the formation of the openings 151 can be laser ablation. Thus, the formation of the openings 151 is not limited to exposure and developing.

The encapsulating member 130 further has a first thickness T13 between the first surface 134a and the second surface 134b, whereas each of the light-emitting components 120 further has a second thickness T12 between the light-emitting surface 121 and the back surfaces 122. By viewing FIG. 7, the first thickness T13 is thicker than the second thickness T12, while the overall thickness of the light-emitting package 100 basically corresponds to the first thickness T13 of the encapsulating member 130.

The light-emitting components 120 may be mini-LEDs or micro-LEDs (μLEDs). When the light-emitting components 120 are mini-LEDs, the second thickness T12 of the light-emitting component 120 may range between 50 μm and 200 μm, and the first thickness T13 of the encapsulating member 130 may range between 75 μm and 250 μm. The difference between the first thickness T13 and the second thickness T12 can range between 25 μm and 50 μm.

When the light-emitting components 120 are micro-LEDs, the second thickness T12 of the light-emitting component 120 may range between 5 μm and 50 μm, and the first thickness T13 of the encapsulating member 130 may range between 10 μm and 100 μm. The difference between the first thickness T13 and the second thickness T12 can range between 5 μm and 50 μm. Therefore, the light-emitting package 100 can have a fairly thin overall thickness, thereby useful for a present thin display, such as a computer monitor, a television, and the screen of a mobile device.

It is noted that the abovementioned ranges of both the first thickness T13 and the second thickness T12, and the range of the difference between the first thickness T13 and the second thickness T12 are only illustrated for example. In other embodiment, the first thickness T13, the second thickness T12, and the difference between the first thickness T13 and the second thickness T12 may have other ranges. For example, the difference between the first thickness T13 and the second thickness T12 may range over 50 μm. Moreover, the first thickness T13 may range over 100 μm. Hence, the abovementioned ranges are not limited to the first thickness T13, the second thickness T12, and the difference between the first thickness T13 and the second thickness T12.

In the light-emitting package 100 as shown in FIG. 7, the first electrode pads 111 respectively have a plurality of first bonding surfaces 111a and are disposed in the encapsulating member 130, in which the first bonding surfaces 111a are exposed on the second surface 134b and flush with the second surface 134b. Similarly, the second electrode pads 112 respectively have a plurality of second bonding surfaces 112a and are disposed in the encapsulating member 130, in which the second bonding surfaces 112a are exposed on the second surface 134b and flush with the second surface 134b.

It is worth mentioning that the protective layer 150 is formed from the insulating layer 13, and the substrate 10 may not include the insulating layer 13 in other embodiment, so that the light-emitting package 100 may not include the protective layer 150. In other words, in the light-emitting package 100 as shown in FIG. 7, the protective layer 150 can be omitted. Hence, the light-emitting package 100 is not limited to including the protective layer 150.

In addition, the light-emitting components 120 may be a plurality of red LEDs, a plurality of green LEDs, and a plurality of blue LEDs, so the light-emitting components 120 can emit red light, green light, and blue light from the light-emitting surfaces 121, so as to cause the light-emitting package 100 to display images. Therefore, the light-emitting package 100 can be used to make a display, especially thin display.

Moreover, the light-emitting components 120 also can emit the rays of light with the same color, for example, white light or blue light. The light-emitting package 100 can be combined with a color filter array substrate, in which the color filter array substrate can convert the colors of the light from the light-emitting components 120 to generate red light, green light, and blue light, so that the light-emitting package 100 is able to display images.

Consequently, since the conductive connection structures are formed before at least one part of the substrate is removed, in the process of patterning the molding compound and the formation of the conductive connection structures, the positions of the light-emitting components on the substrate can basically keep unchanged, so as to reduce or prevent the shifts in the light-emitting components. Therefore, basically, it is not necessary to consider the shifts in the light-emitting components for adjusting the process parameters, so that the manufacturing process can be simplified, thereby helping to shorten the time required to manufacture the light-emitting package and promoting the yield.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A light-emitting package, comprising:
    an encapsulating member, having a first surface and a second surface opposite to the first surface;
    a plurality of light-emitting components, respectively having a plurality of light-emitting surfaces and a plurality of back surfaces opposite to the light-emitting surfaces, wherein the light-emitting components are disposed in the encapsulating member, and the light-emitting surfaces are exposed on the first surface;
    a plurality of first electrode pads, respectively having a plurality of first bonding surfaces and disposed in the encapsulating member, the light-emitting components respectively disposed on the first electrode pads and electrically connected to the first electrode pads, wherein the first bonding surfaces are exposed on the second surface and flush with the second surface;
    a plurality of second electrode pads, respectively having a plurality of second bonding surfaces and disposed in the encapsulating member, wherein the second bonding surfaces are exposed on the second surface and flush with the second surface;
    a plurality of conductive connection structures, passing through the encapsulating member and electrically connected to the light-emitting components and the second electrode pads, thereby causing that each of the light-emitting components is electrically connected to one of the first electrode pads and one of the second electrode pads; and
    a protective layer, formed on the second surface and having a plurality of openings, wherein the openings expose the first bonding surfaces and the second bonding surfaces respectively,
    wherein each of the first electrode pads does not extend to enter any one of the openings,
    wherein each of the second electrode pads does not extend to enter any one of the openings.

2. The light-emitting package of claim 1, wherein the light-emitting components are all vertical LED dies.

3. The light-emitting package of claim 1, wherein an optical density (OD) of the encapsulating member is larger than 2.

4. The light-emitting package of claim 1, wherein a thermal conductivity of the encapsulating member ranges between 5 and 10 $W \cdot m^{-1} \cdot K^{-1}$.

5. The light-emitting package of claim 1, wherein each of the conductive connection structures comprises:
    a conductive column, passing through the encapsulating member and connected to the second electrode pads; and
    a conductive layer, formed on the first surface and connected to the conductive column and the light-emitting components.

6. The light-emitting package of claim 5, wherein at least one of the conductive columns is located between adjacent two of the light-emitting components.

7. The light-emitting package of claim 5, wherein the encapsulating member further has a plurality of connective holes in the first surface, and the connective holes partially expose the light-emitting components;
    wherein each of the conductive layers extends from the first surface to an inside of the connective hole and is connected to the light-emitting component through the connective hole.

8. The light-emitting package of claim 1, wherein the encapsulating member further has a first thickness between the first surface and the second surface, and each of the light-emitting components further has a second thickness between the light-emitting surface and the back surfaces;
    wherein the first thickness is thicker than the second thickness, and a difference between the first thickness and the second thickness ranges between 5 and 50 μm.

9. The light-emitting package of claim 8, wherein the difference between the first thickness and the second thickness ranges between 25 and 50 μm.

* * * * *